(12) United States Patent
Yoo et al.

(10) Patent No.: US 9,905,301 B2
(45) Date of Patent: Feb. 27, 2018

(54) NONVOLATILE MEMORY DEVICE AND METHOD OF OPERATING THE SAME

(71) Applicants: Pil Seon Yoo, Seoul (KR); Ji-Sang Lee, Iksan-si (KR); Gyosoo Choo, Yongin-si (KR)

(72) Inventors: Pil Seon Yoo, Seoul (KR); Ji-Sang Lee, Iksan-si (KR); Gyosoo Choo, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/274,071

(22) Filed: Sep. 23, 2016

(65) Prior Publication Data

US 2017/0133096 A1 May 11, 2017

(30) Foreign Application Priority Data

Nov. 5, 2015 (KR) .................. 10-2015-0155319

(51) Int. Cl.
| | |
|---|---|
| G11C 11/34 | (2006.01) |
| G11C 16/24 | (2006.01) |
| G11C 16/28 | (2006.01) |
| G11C 16/34 | (2006.01) |
| G11C 16/32 | (2006.01) |
| G11C 16/30 | (2006.01) |
| G11C 7/04 | (2006.01) |

(52) U.S. Cl.
CPC ............... *G11C 16/24* (2013.01); *G11C 7/04* (2013.01); *G11C 16/28* (2013.01); *G11C 16/30* (2013.01); *G11C 16/32* (2013.01); *G11C 16/3418* (2013.01); *G11C 16/3459* (2013.01)

(58) Field of Classification Search
CPC ..... G11C 16/24; G11C 16/28; G11C 16/3459; G11C 16/32; G11C 16/30; G11C 7/04; G11C 16/3418
USPC ..................... 365/185.18, 203, 211
See application file for complete search history.

(56) References Cited

U.S. PATENT DOCUMENTS

| | | | |
|---|---|---|---|
| 6,697,283 | B2 | 2/2004 | Marotta et al. |
| 6,898,131 | B2 | 5/2005 | Marotta et al. |
| 7,057,950 | B2 * | 6/2006 | Lee .......... G11C 7/12 365/203 |
| 7,116,088 | B2 | 10/2006 | Tran et al. |
| 7,447,079 | B2 | 11/2008 | Nguyen et al. |
| 7,463,528 | B2 | 12/2008 | Mokhlesi et al. |

(Continued)

*Primary Examiner* — Viet Q Nguyen
(74) *Attorney, Agent, or Firm* — Harness, Dickey & Pierce, P.L.C.

(57) ABSTRACT

A nonvolatile memory device includes a memory cell, a bit line, a page buffer, and a control logic. The page buffer is connected to the memory cell through the bit line and the page buffer is configured to precharge the bit line to perform a desired operation. The desired operation may be one of a read operation and a verify operation. The control logic is configured to control bit line development time differently according to a temperature after precharging the bit line during the desired operation. The control logic is configured to determine the bit line development time according to a period of a reference clock signal that includes a different frequency depending on the temperature and/or a temperature compensation pulse signal including a pulse width that varies based on the temperature.

17 Claims, 13 Drawing Sheets

(56) References Cited

U.S. PATENT DOCUMENTS

| | | | |
|---|---|---|---|
| 7,518,930 B2* | 4/2009 | Miwa | G11C 8/08 |
| | | | 365/185.23 |
| 7,679,133 B2 | 3/2010 | Son et al. | |
| 7,782,678 B2 | 8/2010 | Kern | |
| 8,482,339 B1 | 7/2013 | Giuroiu | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2008/0205163 A1* | 8/2008 | Park | G11C 11/5621 |
| | | | 365/185.23 |
| 2011/0233648 A1 | 9/2011 | Seol et al. | |
| 2012/0137067 A1* | 5/2012 | Lee | G11C 11/5642 |
| | | | 711/114 |
| 2013/0194872 A1* | 8/2013 | Sim | G11C 16/26 |
| | | | 365/185.17 |
| 2014/0022853 A1* | 1/2014 | Choi | G11C 16/24 |
| | | | 365/189.05 |
| 2015/0003167 A1* | 1/2015 | Choi | G11C 16/10 |
| | | | 365/185.19 |
| 2015/0078093 A1* | 3/2015 | Hahn | G11C 16/3459 |
| | | | 365/185.19 |
| 2015/0153955 A1* | 6/2015 | Kwak | G11C 16/0466 |
| | | | 711/103 |
| 2015/0155021 A1* | 6/2015 | Goel | G11C 7/04 |
| | | | 365/207 |
| 2015/0221365 A1 | 8/2015 | Park | |
| 2015/0287444 A1* | 10/2015 | Lee | G11C 7/08 |
| | | | 713/322 |

* cited by examiner

NONVOLATILE MEMORY DEVICE AND METHOD OF OPERATING THE SAME

CROSS-REFERENCE TO RELATED APPLICATIONS

This U.S. non-provisional patent application claims priority under 35 U.S.C. § 119 to Korean Patent Application No. 10-2015-0155319, filed on Nov. 5, 2015, the entire contents of which are hereby incorporated by reference.

BACKGROUND

The present disclosure relates to semiconductor memory devices, and more particularly, to a nonvolatile memory device and a method of operating the same.

A storage device is a device for storing data under the control of a host device such as a computer, a smart phone, a smart pad, etc. A storage device may include a device for storing data in a magnetic disk such as a HDD (hard disk drive) and/or a device for storing data in a semiconductor memory such as a nonvolatile memory such as a SSD (solid state drive), a memory card, etc.

Examples of a nonvolatile memory include a ROM (read only memory), a PROM (programmable ROM), an EPROM (electrically programmable ROM), an EEPROM (electrically erasable and programmable ROM), a flash memory, a PRAM (phase-change RAM), a MRAM (magnetic RAM), a RRAM (resistive RAM), a FRAM (ferroelectric RAM), etc.

A nonvolatile memory device stores data in a memory cell and includes a page buffer connected to a memory cell to store data.

SUMMARY

Example embodiments of inventive concepts relate to a nonvolatile memory device. The nonvolatile memory device includes a memory cell, a bit line, a page buffer, and control logic. The page buffer is connected to the memory cell through the bit line. The page buffer is configured to precharge the bit line to perform a desired operation. The desired operation may be one of a read operation and a verify operation. The control logic is configured to control bit line development time differently according to a temperature. The bit line development time is after precharging the bit line during the desired operation. The control logic is configured to determine the bit line development time according to a period of a reference clock signal that includes a different frequency depending on the temperature.

In example embodiments, the control logic may be configured to cut off a supply of a precharge voltage during the desired operation. The control logic may be configured to compare a voltage level of the bit line with a reference value after cutting off the supply of the precharge voltage. The bit line development time may correspond to an elapsed time after the control logic cuts off the supply of the precharge voltage until the control logic compares the voltage level of the bit line with the reference value.

In example embodiments, the control logic may be configured to control the bit line development time to become shorter at a second temperature compared to the bit line development time at a first temperature if the second temperature is higher than the first temperature.

In example embodiments, the control logic may be configured to generate the reference clock signal to include a higher frequency at a second temperature than at a first temperature if the second temperature is higher than the first temperature.

In example embodiments, the control logic may include a temperature generator and a reference clock generator. The temperature voltage generator may be configured to generate a temperature voltage that varies depending on the temperature based on temperature information. The reference clock generator may be configured to generate a reference clock signal including a different frequency depending on the temperature based on the temperature voltage. A second temperature may be higher than a first temperature. The temperature voltage generator may be configured to generate the temperature voltage to have a lower level at the second temperature than at the first temperature, and the reference clock generator may be configured to generate the reference clock signal to have a higher frequency at the second temperature than at the first temperature.

Example embodiments of inventive concepts relate to a nonvolatile memory device. The nonvolatile memory device includes a memory cell, a bit line, a page buffer, and control logic. The page buffer is connected to the memory cell through the bit line. The page buffer is configured to precharge the bit line to perform a desired operation, the desired operation being one of a read and a verify operation. The control logic is configured to generate a temperature compensation pulse signal including a pulse width that varies based on a temperature. The control logic is configured to control a bit line development time differently depending based on the pulse width of the temperature compensation pulse signal. The bit line time is after precharging the bit line during the desired operation.

In example embodiments, the control logic may include a temperature voltage generator, a reference current generator, and a temperature compensation pulse generator. The temperature voltage generator may be configured to generate a temperature voltage that varies depending on the temperature based on temperature information. The reference current generator may be configured to provide a reference current to the temperature compensation pulse generator regardless of the temperature based on a reference voltage, and the temperature compensation pulse generator may be configured to determine the pulse width of the temperature compensation pulse signal based on a voltage reduced from the temperature voltage at a specific rate according to the reference current and the reference voltage.

In example embodiments, the temperature compensation pulse generator may be configured to determine the specific rate according to the reference current regardless of the temperature.

In example embodiments, a first temperature may be less than a second temperature. The temperature voltage generator may be configured to generate the temperature voltage to have a lower level at the second temperature than at the first temperature. The temperature compensation pulse generator may be configured to generate the temperature compensation pulse signal to have a smaller pulse width at the second temperature than at the first temperature.

In example embodiments, the reference current generator may include: a first resistor including one end connected to a ground terminal and an other end connected to a first node; a second resistor including one end connected to the first node; a first comparator configured to output a comparison result value based on the reference voltage and a voltage of the first node; a first transistor including one end connected to the other end of the second resistor, an other end of the first transistor connected to a power supply terminal, and the first transistor may be configured to turn on according to an output of the first comparator; a second transistor including one end connected to the power supply terminal and an other end connected to a second node, and the second transistor configured to turn on according to the output of the first comparator; and a third transistor including one end connected to the second node and an other end connected to the ground terminal, and the third transistor may be configured to turn on according to a voltage level of the second node.

In example embodiments, the temperature compensation pulse generator may include: a fourth transistor including one end connected to the ground terminal and an other end connected to a third node, the fourth transistor configured to turn on according to the voltage level of the second node; a fifth transistor including one end connected to the third node and an other end connected to a fourth node; a sixth transistor including one end connected to the fourth node and an other end of which may be connected to the temperature voltage terminal; a first capacitor connected between the fourth node and the ground terminal; and a second comparator configured to generate the temperature compensation pulse signal based on the reference voltage and a voltage of the fourth node, wherein the fifth and sixth transistors may be configured to complementarily turn on or turn off according to a start signal.

In example embodiments, the first capacitor may be configured to charge based on the temperature voltage and may be configured to discharge based on the reference current, and the voltage of the fourth node may be determined according to charge and discharge of the first capacitor.

In example embodiments, the voltage of the fourth node may be reduced from the temperature voltage according to a time constant of the first capacitor.

In example embodiments, the reference current may be determined according to the voltage level of the first node.

In example embodiments, a nonvolatile memory device includes a memory cell array; a bit line connected to the memory cell array; a page buffer connected to the memory cell array through the bit line, the page buffer configured to precharge the bit line during an operation; and control logic. The control logic is configured to control a bit line development time differently during the operation according to a temperature. The bit line development time is after precharging the bit line during the operation. The control logic is configured to determine the bit line development time based on at least one of a period of a reference clock signal that has a different frequency depending on the temperature, and a temperature compensation pulse signal generated by the control logic and including a pulse width that varies based on the temperature.

In example embodiments, the control logic may be configured to determine the bit line development time based on the period of the reference clock signal. The control logic may be configured to cut off a supply of a precharge voltage to the bit line during the operation. The control logic may be configured to detect a state of a memory cell in the cell array during the operation based on comparing a voltage level of the bit line with a reference value after cutting off the supply of the precharge voltage. The bit line development time may correspond to an elapsed time after the control logic cuts off the supply of the precharge voltage until the control logic compares the voltage level of the bit line with the reference value. The control logic may be configured to control the bit line development time to become shorter at a second temperature compared to the bit line development time at a first temperature if the second temperature is higher than the first temperature.

In example embodiments, the control logic may be configured to determine the bit line development time based on the temperature compensation pulse signal generated by the control logic.

In example embodiments, the operation may be one of a read operation and a verify operation.

In example embodiments, the memory cell array may include a plurality of strings on a substrate, and each of the strings may include a plurality of memory cells stacked on top of each other between a ground selection transistor and a string selection transistor.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
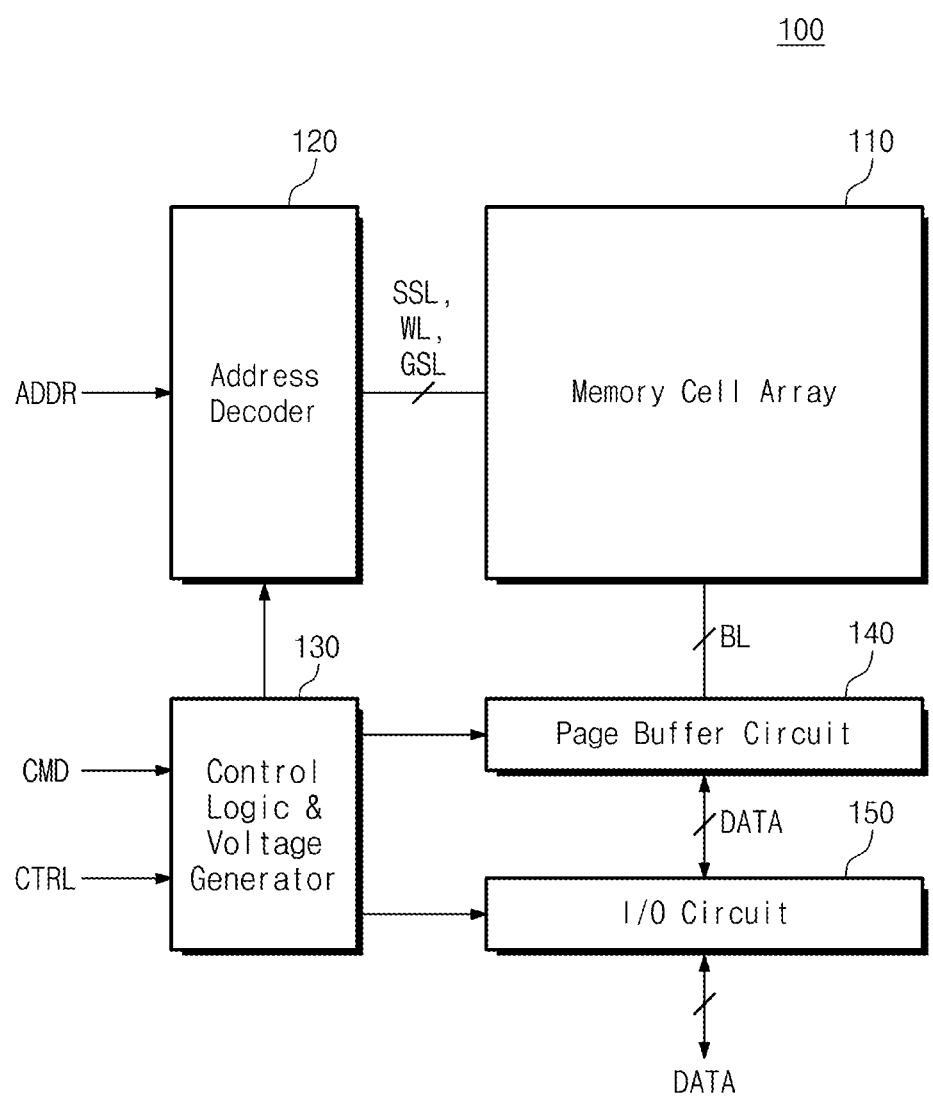
FIG. 1 is a block diagram illustrating a nonvolatile memory device in accordance with example embodiments of inventive concepts.

Example embodiments of inventive concepts will be described more fully hereinafter with reference to the accompanying drawings, in which some example embodiments are shown. Inventive concepts may, however, be embodied in many different forms and should not be construed as limited to example embodiments described herein. Rather, these example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a nonvolatile memory device in accordance with example embodiments of inventive concepts. Referring to FIG. 1, the nonvolatile memory device 100 may include a memory cell array 110, an address decoder 120, a control logic & voltage generator 130, a page buffer circuit 140 and an input/output circuit 150.

The memory cell array 110 may include a plurality of memory blocks. Memory cells of each memory block may form a two-dimensional structure. Also, memory cells of each memory block may be laminated in a direction perpendicular to a substrate to form a three-dimensional structure. Each memory block may include a plurality of cell strings and each cell string may include a plurality of memory cells. The plurality of memory cells may be connected to a plurality of word lines WL. Each memory cell may be provided as a SLC (single level cell) storing 1 bit or as a MLC (multi level cell) storing at least 2 bits.

The address decoder 120 may be connected to the memory cell array 110 through a plurality of word lines WL, a string select line SSL and a ground select line GSL. In a case where the memory cell array 110 is formed to have a three-dimensional structure, the address decoder 120 may be connected to the memory cell array 110 through a plurality of word lines WL, string select lines SSL and ground select lines GSL. The address decoder 120 can receive an address ADDR from an external device (e.g., a memory controller, a host, AP, etc.) and can decode the received address to select at least one among the plurality of word lines WL. The address decoder 120 can control voltages of the word lines WL respectively so that a read and/or write operation is performed with respect to the selected word line. For example, the address decoder 120 can decode a column address from the received address and can transmit the decoded column address to the page buffer circuit 140. The page buffer circuit 140 can control a bit line BL on the basis of the received column address.

The control logic & voltage generator 130 can receive a command CMD and a control signal CTRL from an external device and can control the address decoder 120, the page buffer circuit 140 and the input/output circuit 150 in response to the received signals. For example, the control logic & voltage generator 130, in response to a command CMD and a control signal CTRL, can control the address decoder 120, the page buffer circuit 140 and the input/output circuit 150 so that data DATA is written in the memory cell array 110. The control logic & voltage generator 130, in response to a command CMD and a control signal CTRL, can also control the address decoder 120, the page buffer circuit 140 and the input/output circuit 150 so that data DATA stored in the memory cell array 110 is output. The control logic & voltage generator 130, in response to a command CMD and a control signal CTRL, can also control the address decoder 120, the page buffer circuit 140 and the input/output circuit 150 so that a part of the memory cell array 110 is erased.

The control logic & voltage generator 130 can generate various voltages used in an operation of the nonvolatile memory device 100. For example, the control logic & voltage generator 130 can generate various voltages such as a plurality of read voltages, a plurality of verify voltages, a plurality of program voltages, a plurality of pass voltages, a plurality of erase voltages, etc. to provide those voltages to the address decoder 120.

The page buffer circuit 140 may be connected to the memory cell array 110 through a plurality of bit lines BL. The page buffer circuit 140 can temporarily store data DATA read from the memory cell array 110 and/or can temporarily store data DATA to be written in the memory cell array 110.

The input/output circuit 150 can receive data DATA from an external device to transmit the received data DATA to the page buffer circuit 140 under the control of the control logic & voltage generator 130. The input/output circuit 150 can also transmit data DATA received from the page buffer circuit 140 to an external device under the control of the control logic & voltage generator 130.

In a program operation of the nonvolatile memory device 100, data DATA to be programmed in the memory cell array 110 may be temporarily stored in the page buffer circuit 140. The nonvolatile memory device 100 can program data DATA stored in the page buffer circuit 140 in the memory cell array 110 by performing a plurality of program loops. Each program loop may include a program step of applying a program pulse and a verify step of applying a verify voltage.

The nonvolatile memory device 100 can determine a program state (or a threshold voltage distribution) of the memory cells on the basis of data DATA stored in the page buffer circuit 140. The nonvolatile memory device 100 can determine a target program state (or a target threshold voltage distribution) of the memory cells on the basis of a desired (and/or alternatively predetermined) bit ordering. The nonvolatile memory device 100 can perform a plurality of program loops so that the memory cells have a target program state.

Figure 2:
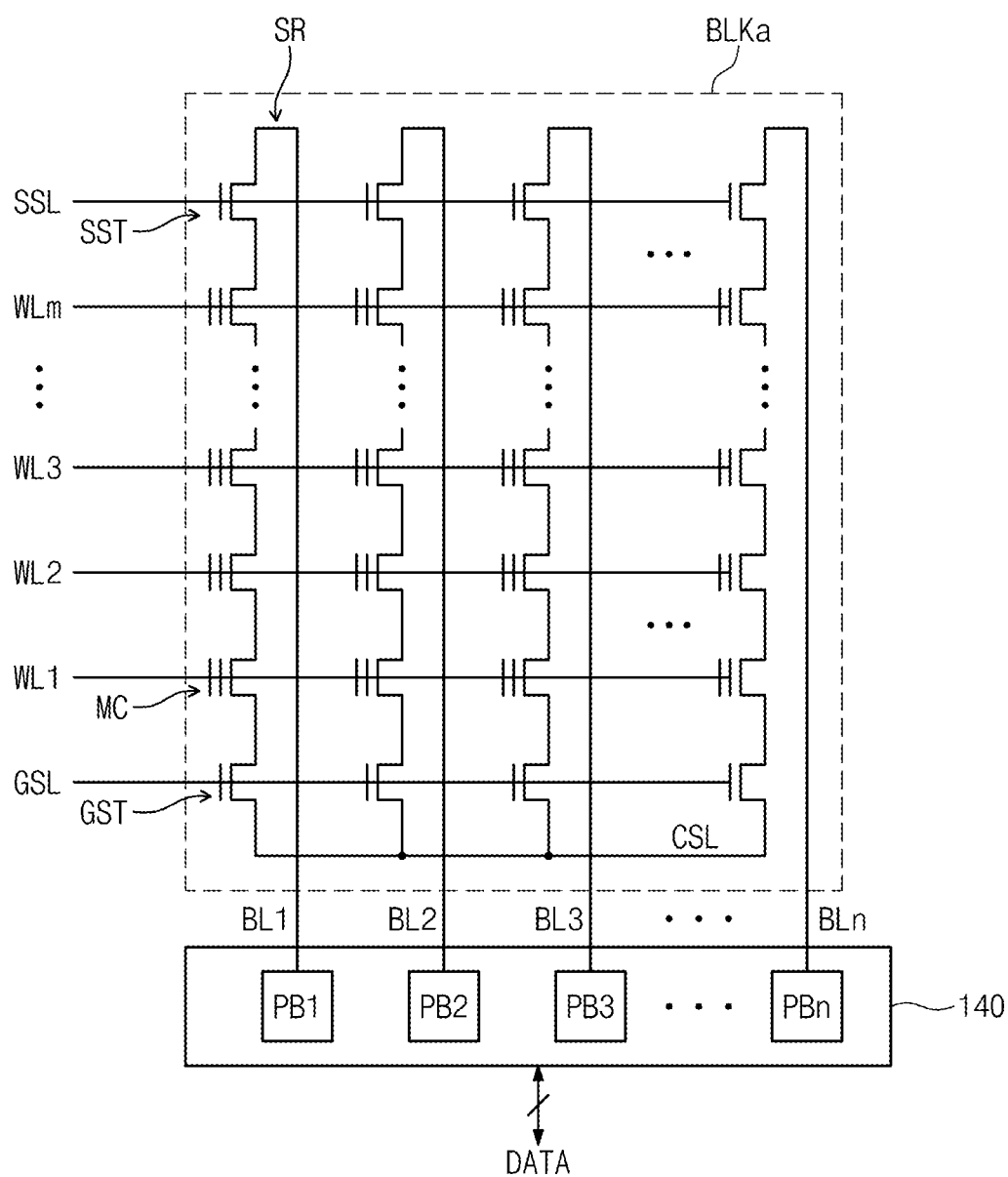
FIG. 2 is a drawing illustrating one memory block (BLKa) among the memory blocks included in a memory cell array of FIG. 1.

FIG. 2 is a drawing illustrating one memory block (BLKa) among the memory blocks included in a memory cell array of FIG. 1. Referring to FIGS. 1 and 2, the memory block BLKa may include a plurality of strings SR. The plurality of strings SR may be connected to a plurality of bit lines BL1~BLn respectively. Each string SR may include a ground select transistor GST, memory cells MC and a string select transistor SST. Although not illustrated in the drawing, in a case where the memory cell array 110 is formed to have a three-dimensional structure, each bit line BL may be connected to a plurality of strings SR connected to string select lines SSL different from one another.

A ground select transistor GST of each string SR may be connected between memory cells MC and a common source line CSL. Ground select transistors GST of the plurality of strings SR may be connected to the common source line CSL in common.

A string select transistor SST of each string SR may be connected between memory cells MC and bit lines BL. String select transistors SST of the plurality of strings SR may be connected to the plurality of bit lines BL1~BLn respectively.

In each string SR, a plurality of memory cells MC is provided between a ground select transistor GST and a string select transistor SST. In each string SR, the plurality of memory cells MC may be serially connected to one another.

In the plurality of strings SR, memory cells MC located at the same order from the common source line CSL may be connected to one word line in common. Memory cells MC of the plurality of strings SR may be connected to a plurality of word lines WL1~WLm.

Program and read operations of the memory cells MC may be performed by a word line unit. Memory cells MC connected to one word line may be programmed at the same time and/or read at the same time. An erase operation of the memory cells MC may be performed by a memory block unit. Memory cells MC of one memory block BLKa may be erased at the same time. An erase operation of the memory cells MC may also be performed by a sub block unit. One memory block BLKa may be divided into a plurality of sub blocks and memory cells MC of one sub block may be erased at the same time.

The page buffer circuit 140 may include a plurality of page buffers PB1~PBn. Each of the page buffers PB1~PBn may be connected to each of the bit lines BL1~BLn. The page buffer circuit 140 can temporarily store data DATA read from the memory cell array 110 or can temporarily store data DATA to be written in the memory cell array 110. For example, each of the page buffers PB1~PBn may include a plurality of latches. The latches can temporarily store data DATA.

Figure 3:
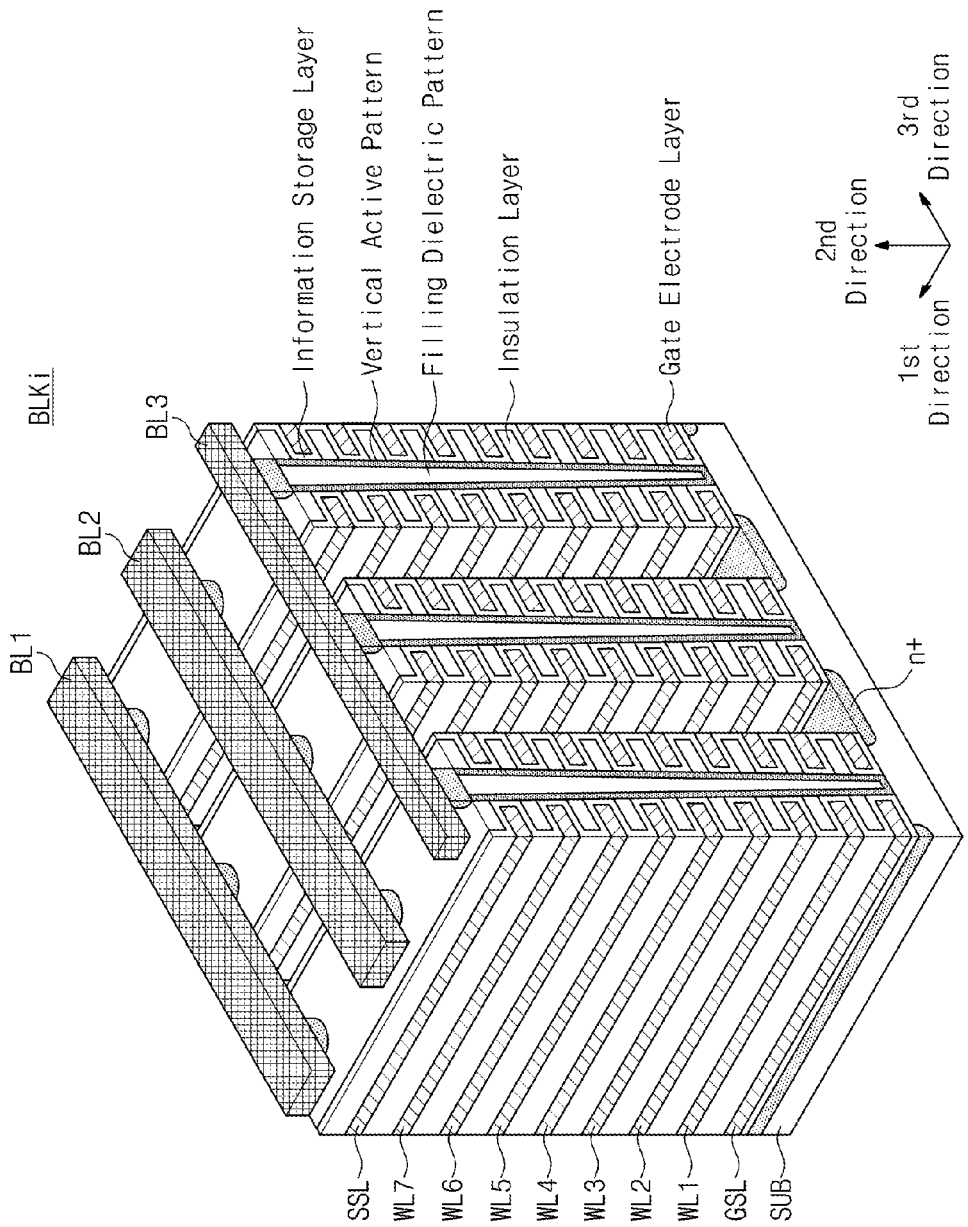
FIG. 3 is a perspective view illustrating an example of a structure corresponding to one (BLKi) of memory blocks included in a memory cell array of FIG. 1.

FIG. 3 is a perspective view illustrating an example of a structure corresponding to one (BLKi) of memory blocks included in a memory cell array of FIG. 1. Referring to FIG. 3, the memory block BLKi may be formed in a direction perpendicular to a substrate SUB. An n+doping region may be formed in the substrate SUB.

A plurality of gate electrode layers and a plurality of insulation layers may be alternately deposited on the substrate SUB. An information storage layer may be formed between the gate electrode layer and the insulation layer. The gate electrode layer and the insulation layer may be vertically patterned to form a pillar having a V charter shape. The pillar may penetrate the gate electrode layer and the insulation layer to connect to the substrate SUB. The inside of the pillar may include a filling dielectric pattern and may include an insulating material (e.g., silicon oxide). The outside of the pillar is a vertical active pattern and may include a channel semiconductor (e.g., silicon).

The gate electrode layer of the memory block BLKi may be connected to a ground select line GSL, a plurality of word lines WL1~WL7 and a string select line SSL. Pillars of the memory block BLKi may be connected to a plurality of bit lines BL1~BL3. In FIG. 3, it is illustrated that one memory block BLKi has two select lines GSL and SSL, seven word lines WL1~WL7 and three bit lines BL1~BL3. However, inventive concepts are not limited thereto.

Figure 4:
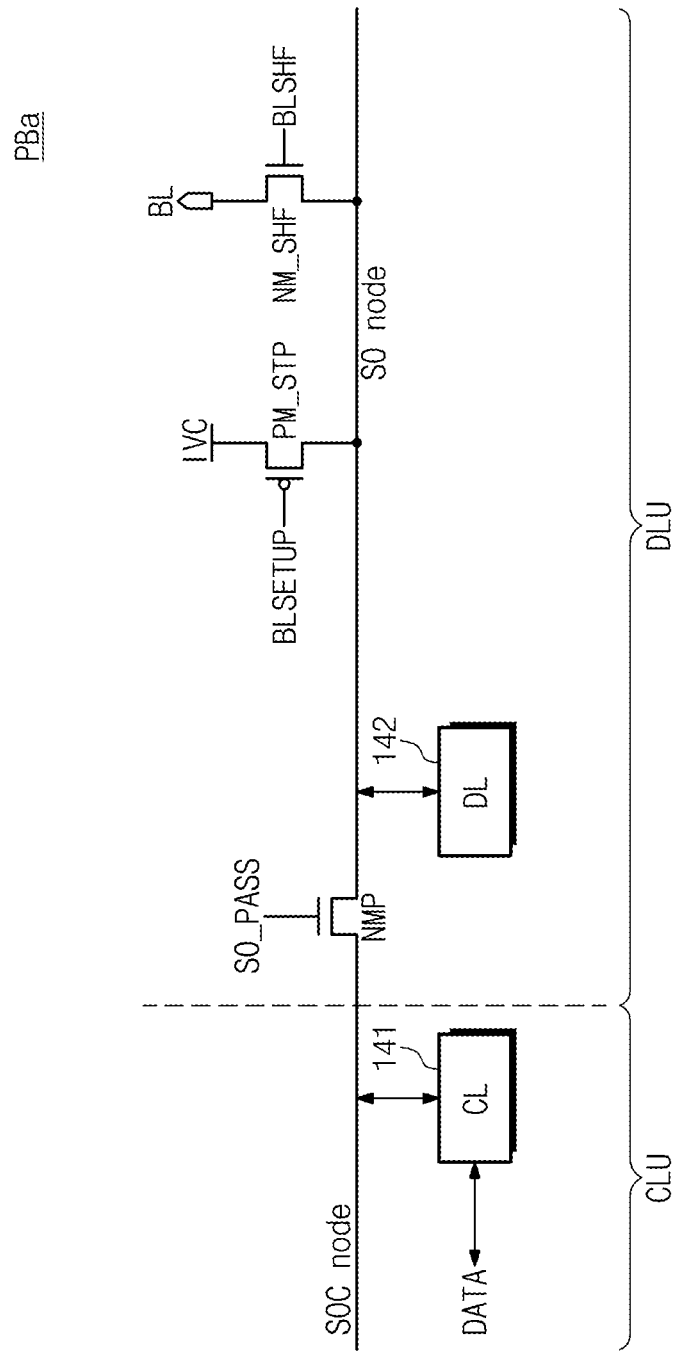
FIG. 4 is a drawing illustrating one page buffer (PBa) among the page buffers of FIG. 2.

FIG. 4 is a drawing illustrating one page buffer (PBa) among the page buffers of FIG. 2. Referring to FIG. 4, the page buffer PBa may include a cache latch unit CLU and a data latch unit DLU.

The cache latch unit CLU may include a cache latch 141. For example, the cache latch 141 can store data DATA to be stored in a memory cell. The cache latch 141 can also store data DATA transmitted from a data latch 142. The cache latch 141 may be connected to a cache latch node SOC. The cache latch 141 can transmit and receive data DATA through the cache latch node SOC. The cache latch unit CLU may include at least two cache latches.

The cache latch node SOC may be connected to a data latch node SO through a pass transistor NMP. The pass transistor NMP may be turned on or turned off depending on a pass signal SO_PASS. In a case where the pass transistor NMP is turned on, data DATA may be transmitted between the cache latch 141 and the data latch 142.

The data latch unit DLU may include the data cache 142. For example, the data cache 142 can store data DATA transmitted from the cache latch 141. The data cache 142 can also store data DATA read from a memory cell. The data cache 142 may be connected to the data latch node SO. The data cache 142 can transmit and receive data DATA through the data latch node SO. The data latch unit DLU may include at least two data latches.

The data latch node SO may be precharged during a read, write or erase operation of the nonvolatile memory device 100. For example, the data latch node SO may be precharged according to an internal supply voltage IVC through a setup transistor PM_STP. The setup transistor PM_STP may be turned on or turned off depending on a bit line setup signal BLSETUP. The setup transistor PM_STP may be a P-type transistor. However, a type of the setup transistor PM_STP is not limited thereto. For example, the data latch node SO may be connected to bit lines BL through a shutoff transistor NM_SHF. The shutoff transistor NM_SHF may be turned on or turned off depending on a bit line shutoff signal BLSHF. The bit line shutoff signal BLSHF may be an N-type transistor. However, a type of the shutoff transistor NM_SHF is not limited thereto.

Figure 5:
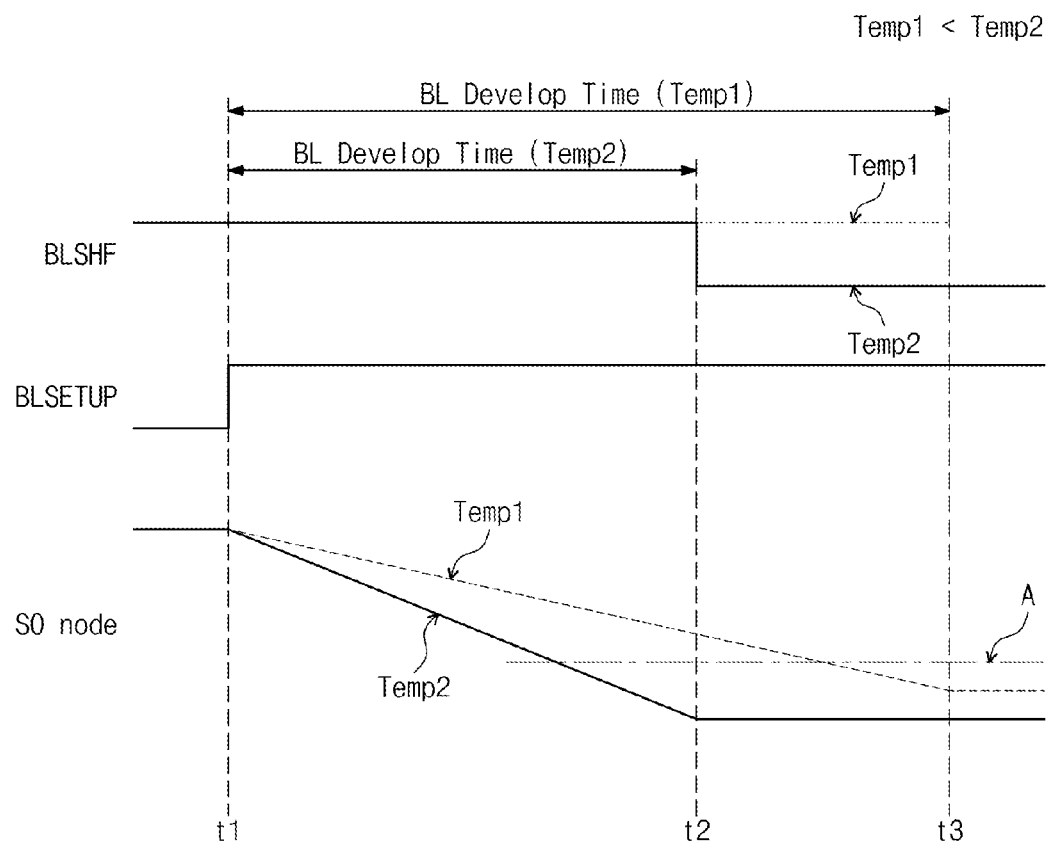
FIG. 5 is a timing diagram illustrating an operation of a data latch node (S0) in the page buffer (PBa) of FIG. 4.

FIG. 5 is a timing diagram illustrating an operation of a data latch node (SO) in the page buffer (PBa) of FIG. 4. Referring to FIGS. 4 and 5, the data latch node SO may be precharged according to the internal supply voltage IVC before a first time (t1). For example, before the first time (t1), the bit line setup signal BLSETUP has a low level and the bit line shutoff signal BLSHF has a high level. Thus, the setup transistor PM_STP and the shutoff transistor NM_SHF may be turned on. At this time, the bit line BL may also be precharged together with the data latch node SO.

At the first time (t1), the bit line setup signal BLSETUP may be changed to have a high level. Thus, the setup transistor PM_STP may be turned on. Then, a voltage level of the latch node SO is reduced according to a state of a selected memory cell. In a case where a voltage that is lower than a threshold voltage of the selected memory cell is applied to a select word line (in a case where the selected memory cell is an on-cell), the data latch node SO may maintain the voltage level as it is or a voltage of the data latch node SO may be slightly reduced. In a case where a voltage that is higher than a threshold voltage of the selected memory cell is applied to a select word line (in a case where the selected memory cell is an off-cell), as time passes, a voltage of the data latch node SO may be gradually reduced. Thus, the nonvolatile memory device 100, after a specific time, can compare a voltage level of the data latch node SO with a reference value A to detect a state of the selected memory cell.

In a case where the selected memory cell is an off-cell, a voltage falling rate of the data latch node SO is different depending on a temperature. A voltage falling rate of the data latch node SO at a low temperature is gradually reduced. Thus, if applying the same BL (bit line) development time regardless of a temperature, probability of an operation error increases. For example, in the case of a first temperature Temp 1, a voltage level of the data latch node SO measured at a second time (t2) may be higher than the reference value A. The BL development time is the time taken for the shutoff transistor NM_SHF to be turned off after the setup transistor PM_STP is turned off. In FIG. 4, only a case where the selected memory cell is an off-cell is illustrated. In a case where the selected memory cell is an on-cell, since a voltage level of the data latch node SO has only to be greater than the reference value A, a temperature effect is relatively small.

In example embodiments, the nonvolatile memory device 100 can control the BL development time according to a temperature. For example, the nonvolatile memory device 100 can control the BL development time to be shorter at the second temperature Temp2 than the BL development time at the first temperature Temp1. The first temperature Temp1 is lower than the second temperature Temp2.

In the case of the first temperature Temp1, the nonvolatile memory device 100 can control the bit line shutoff signal BLSHF to have a low level at a third time (t3). Then, the bit line shutoff signal BLSHF is turned off at the third time (t3) and the nonvolatile memory device 100 can compare a voltage level of the data latch node SO at the third time (t3) with the reference value A.

In the case of the second temperature Temp2, the nonvolatile memory device 100 can control the bit line shutoff signal BLSHF to have a low level at second time (t2). Then, the bit line shutoff signal BLSHF is turned off at the second time (t2) and the nonvolatile memory device 100 can compare a voltage level of the data latch node SO at the second time (t2) with the reference value A.

Figure 6:
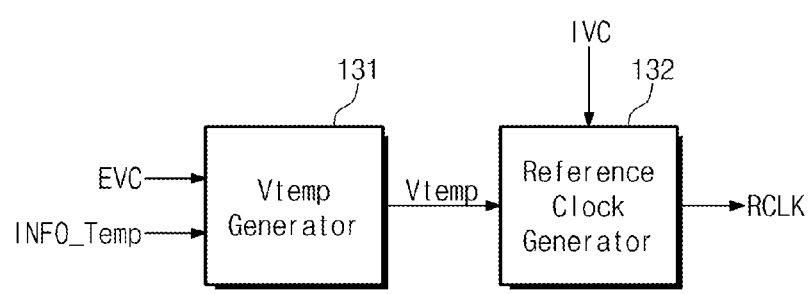
FIG. 6 is a block diagram illustrating a reference clock generator in accordance with example embodiments of inventive concepts.

FIG. 6 is a block diagram illustrating a reference clock generator in accordance with example embodiments of inventive concepts. Referring to FIG. 6, the reference clock generator 132 is configured to generate a reference clock signal RCLK for deciding a fall time of the bit line shutoff signal BLSHF.

The control logic & voltage generator 130 may include a temperature voltage generator 131 and the reference clock generator 132. The temperature voltage generator 131 can receive an external supply voltage EVC and temperature information INFO_Temp. The temperature voltage generator 131 can generate a temperature voltage Vtemp that varies according to a temperature on the basis of the external supply voltage EVC and the temperature information INFO_Temp. The reference clock generator 132 can receive an internal supply voltage IVC and a temperature voltage Vtemp. The reference clock generator 132 can generate a reference clock signal RCLK having a different frequency depending on a temperature on the basis of the temperature voltage Vtemp that varies according to a temperature.

Figure 7:
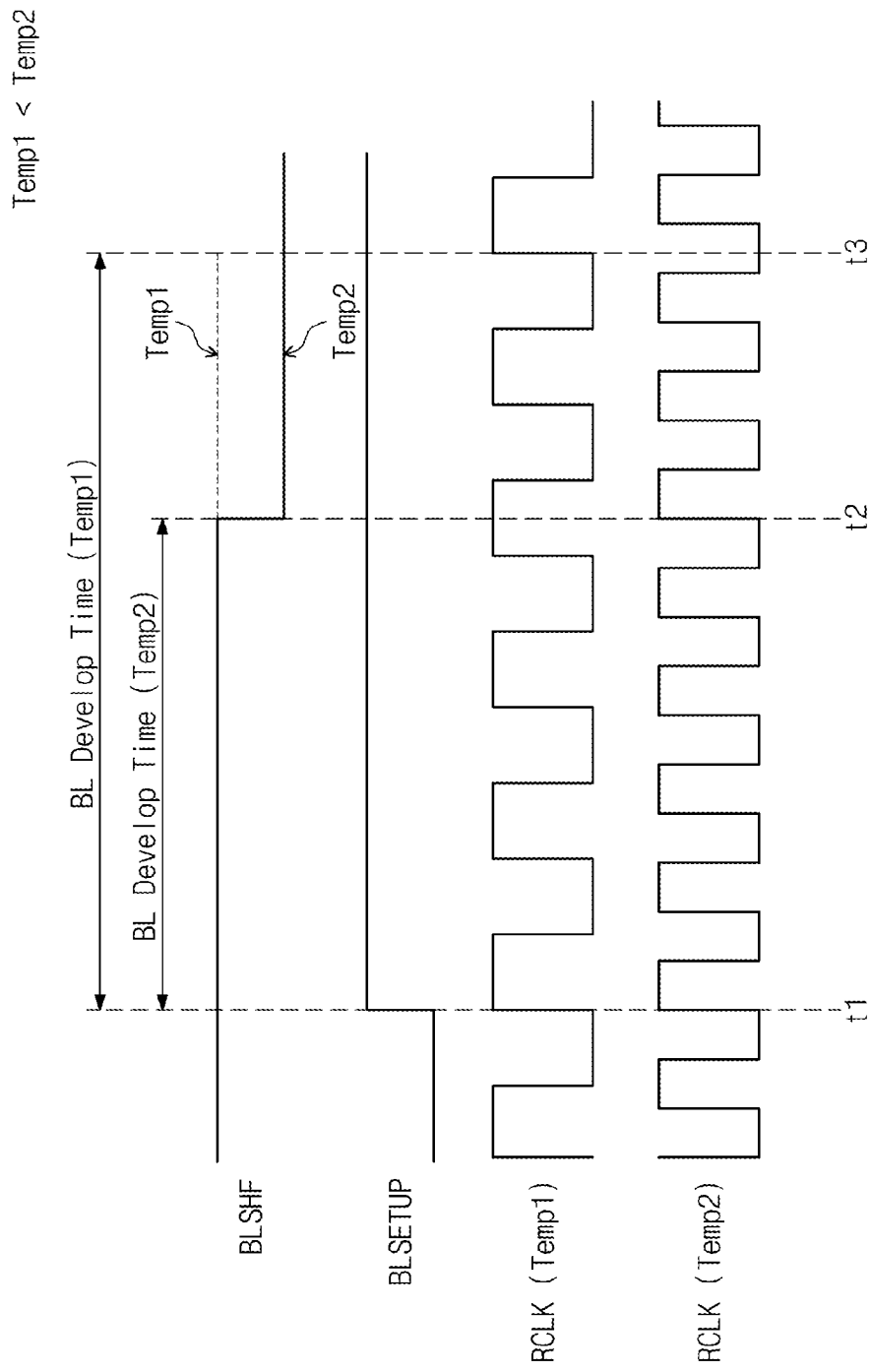
FIG. 7 is a timing diagram illustrating a reference clock signal differently generated depending on a temperature by the reference clock generator of FIG. 6.

FIG. 7 is a timing diagram illustrating a reference clock signal differently generated depending on a temperature by the reference clock generator of FIG. 6. Referring to FIGS. 6 and 7, the reference clock generator 132 can generate a reference clock signal RCLK having different frequencies depending on temperatures Temp1 and Temp2.

For example, in the case of the first temperature Temp1, the reference clock generator 132 can generate a reference clock signal RCLK having 5 periods between a first time (t1) and a third time (t3). In the case of the second temperature Temp2, the reference clock generator 132 can generate a reference clock signal RCLK having 5 periods between the first time (t1) and a second time (t2).

The nonvolatile memory device 100 can change a level of the bit line shutoff signal BLSHF to a low level after a specific period of the reference clock signal RCLK. For example, the nonvolatile memory device 100 can change a level of the bit line shutoff signal BLSHF to a low level at a rising edge after 5 periods of the reference clock signal RCLK from the first time (t1). Since a frequency of the reference clock signal RCLK is different depending on the first temperature Temp1 and the second temperature Temp2, a level of the bit line shutoff signal BLSHF may be changed to a low level at a different time depending on the first temperature Temp1 and the second temperature Temp2. Thus, the BL development time may be differently controlled depending on a temperature.

Figure 8:
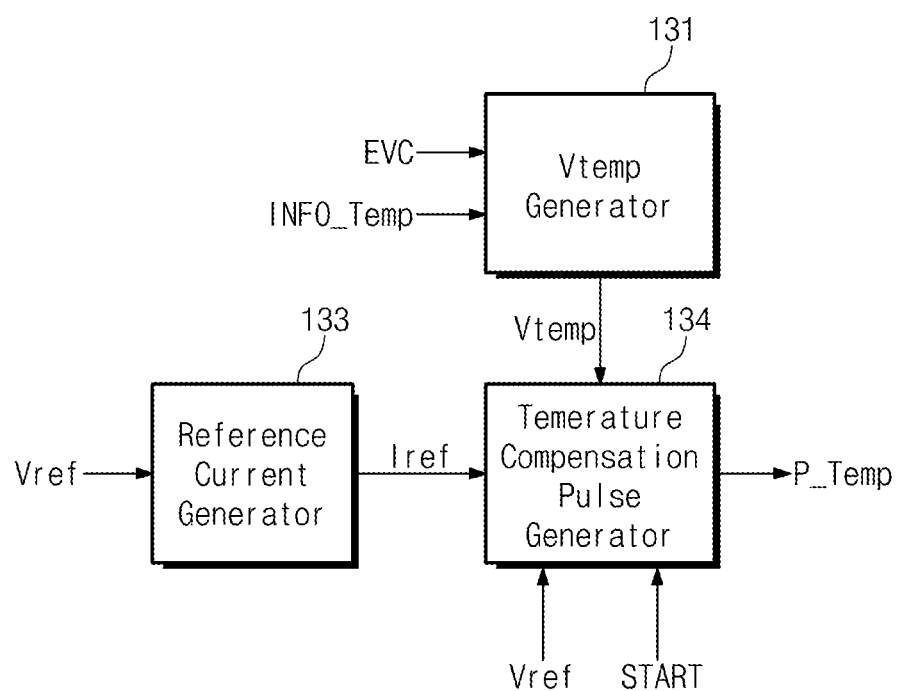
FIG. 8 is a block diagram illustrating a temperature compensation pulse generator in accordance with example embodiments of inventive concepts.

FIG. 8 is a block diagram illustrating a temperature compensation pulse generator in accordance with example embodiments of inventive concepts. Referring to FIG. 8, the nonvolatile memory device 100 can control the BL development time differently depending on a temperature using a different method from the method described in FIGS. 6 and 7.

The control logic & voltage generator 130 may include the temperature voltage generator 131, a reference current generator 133 and a temperature compensation pulse generator 134. The temperature voltage generator 131 can receive an external supply voltage EVC and temperature information INFO-Temp. The temperature voltage generator 131 can generate a temperature voltage Vtemp that varies according to a temperature on the basis of the external supply voltage EVC and the temperature information INFO-Temp.

The reference current generator 133 can generate a reference current Iref independently from a temperature change on the basis of a reference voltage Vref.

The temperature compensation pulse generator 134 can receive the temperature voltage Vtemp, the reference current Iref, the reference voltage Vref and a start signal START. The temperature compensation pulse generator 134 can generate a temperature compensation pulse signal P_Temp according to the start signal START. The temperature compensation pulse generator 134 can compare the reference voltage Vref with a voltage being reduced from the temperature voltage Vtemp based on the reference current Iref to generate a temperature compensation pulse signal P_Temp having a different pulse width depending on a temperature.

Figure 9:
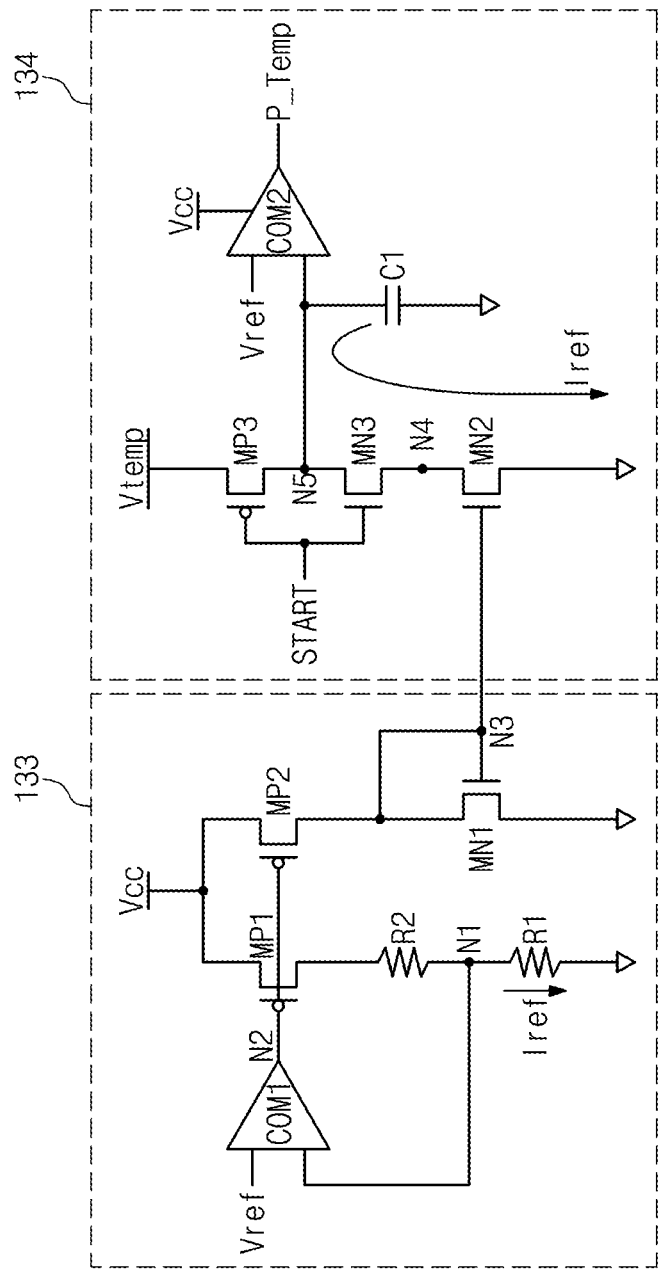
FIG. 9 is a circuit diagram illustrating the temperature compensation pulse generator of FIG. 8 in detail.

FIG. 9 is a circuit diagram illustrating the temperature compensation pulse generator of FIG. 8 in detail. Referring to FIG. 9, the reference current generator 133 can compare the reference voltage Vref with a voltage of a first node N1 to generate a reference current Iref independently from a temperature change. The temperature compensation pulse generator 134 can compare the reference voltage Vref with a voltage being reduced at a fixed rate from the temperature voltage Vtemp based on the reference current Iref to generate a temperature compensation pulse signal P_Temp.

A first comparator COM1 can compare the reference voltage Vref with the voltage of the first node N1. The first comparator COM1 can compare the reference voltage Vref with the voltage of the first node N1 to control a voltage of a second node N2 so that the reference current Iref flows through a first resistor. First and second PMOS transistors MP1 and MP2 are controlled so that the reference current Iref has a certain value according to the voltage of the second node N2. The reference current Iref having the same value also flows through a first NMOS transistor MN1.

A third PMOS transistor MP3 and a third NMOS transistor MN3 may complementarily operate according to the start signal START. For example, if the third PMOS transistor MP3 is turned on, the third NMOS transistor MN3 is turned off. On the contrary, if the third NMOS transistor MN3 is turned on, the third PMOS transistor MP3 is turned off. Thus, a first capacitor C1 may be charged or discharged. When the first capacitor C1 is discharged, the reference current Iref flows through a second NMOS transistor MN2. This is because the same voltage is provided to a gate of the first and second NMOS transistors MN1 and MN2. Thus, a voltage of a fifth node N5 is charged to the temperature voltage Vtemp and then is reduced at the same rate according to the reference current Iref regardless of a temperature. A second comparator COM2 can generate a temperature compensation pulse signal P_Temp with a pulse width corresponding to the time taken until the third PMOS transistor MP3 is turned on again from when the voltage of the fifth node N5 becomes the same as the reference voltage Vref.

Figure 10:
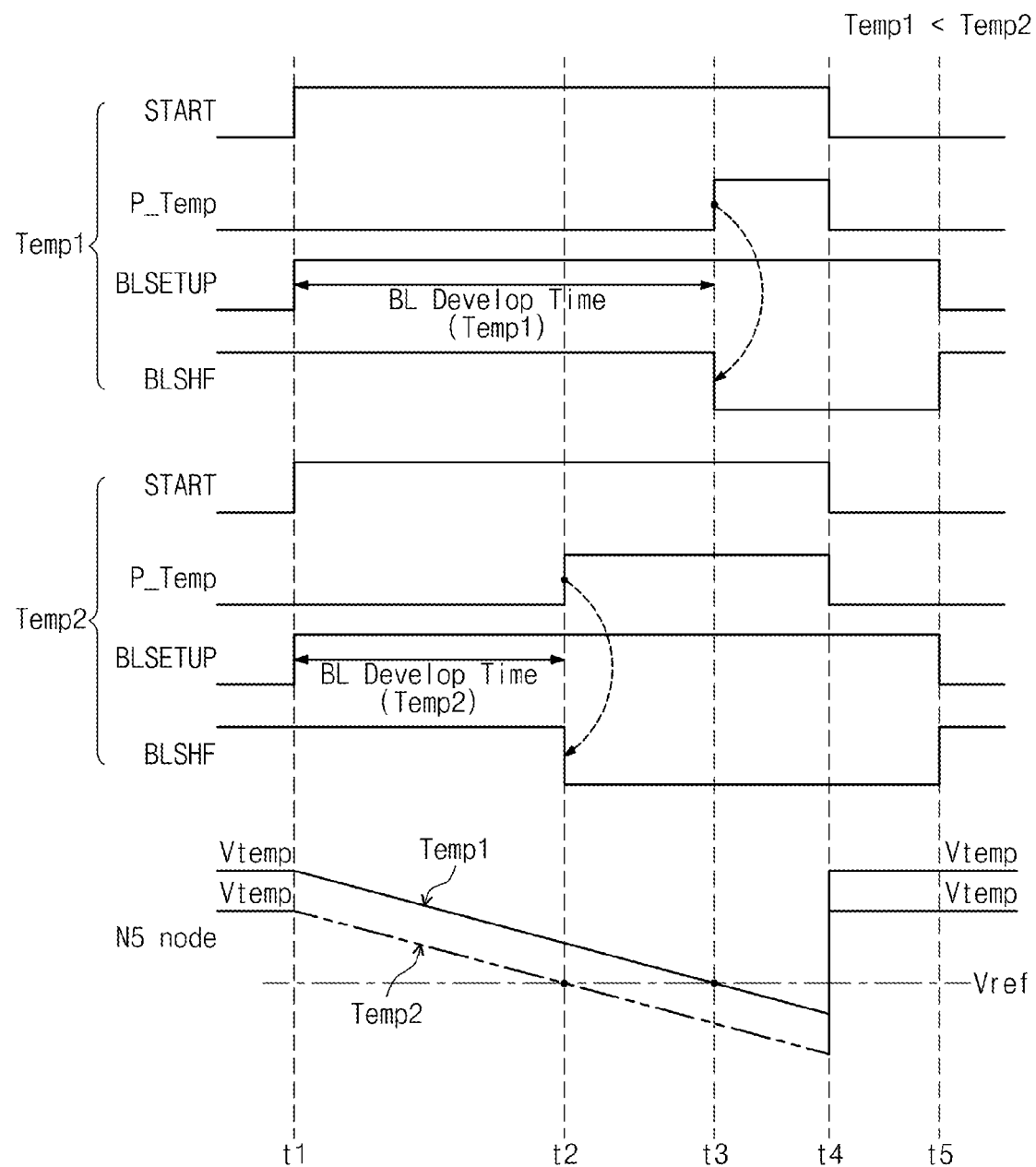
FIG. 10 is a timing diagram illustrating a temperature compensation pulse differently generated depending on a temperature by the temperature compensation pulse generator of FIG. 9.

FIG. 10 is a timing diagram illustrating a temperature compensation pulse differently generated depending on a temperature by the temperature compensation pulse generator of FIG. 9.

Referring to FIGS. 9 and 10, a level of the temperature voltage Vtemp is different depending on first and second temperatures Temp1 and Temp2. Thus, at a first time (0), a voltage of the fifth node N5 may begin to be reduced from different levels depending on the first and second temperatures Temp1 and Temp2. However, voltage reduction slopes of the fifth node N5 are the same by the reference current Iref. Thus, a voltage of the fifth node N5 at the first temperature Temp1 meets the reference voltage Vref at a third time (t3). A voltage of the fifth node N5 at the second temperature Temp2 meets the reference voltage Vref at a second time (t2). At a fourth time (t4), a level of the start signal START becomes low and thereby a voltage of the fifth node N5 is charged to the temperature voltage Vtemp again.

At the first temperature Temp1, the temperature compensation pulse signal P_Temp may have a pulse width corresponding to a time distance between the third time (t3) and the fourth time (t4). At the second temperature Temp2, the temperature compensation pulse signal P_Temp may have a pulse width corresponding to a time distance between the second time (t2) and the fourth time (t4). The nonvolatile memory device 100 may decide a fall time of the bit line shutoff signal BLSHF on the basis of the temperature compensation pulse signal P-Temp.

Figure 11:
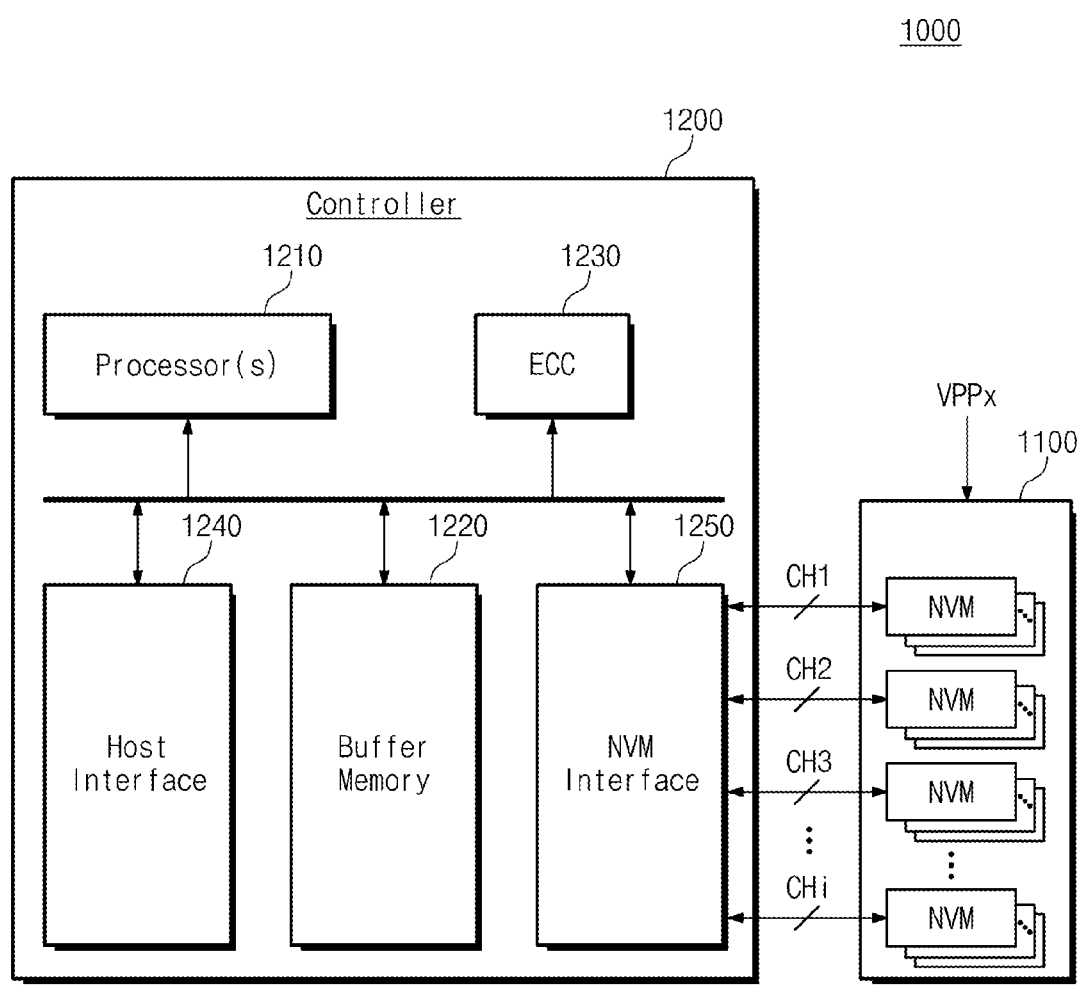
FIG. 11 is a block diagram illustrating a SSD in accordance with example embodiments of inventive concepts.

FIG. 11 is a block diagram illustrating a SSD in accordance with example embodiments of inventive concepts. Referring to FIG. 11, the SSD 1000 may include nonvolatile memory devices 1100 and a SSD controller 1200.

The nonvolatile memory devices 1100 may be configured to selectively receive an external high voltage Vppx. Each of the nonvolatile memory devices 1100, as described in FIGS. 1 through 10, can control a bit line development time according to a temperature. Thus, the nonvolatile memory devices 1100 can improve and/or optimize a distribution of cells according to a temperature to reduce an operation error.

The SSD controller 1200 is connected to the nonvolatile memory devices 1100 through a plurality of channels CH1~CHi (i is an integer which is 2 or greater than 2). The SSD controller 1200 may include at least one processor 1210, a buffer memory 1220, an error correction circuit 1230, a host interface 1240, and a nonvolatile memory interface 1250.

The buffer memory 1220 temporarily stores data used to drive the SSD controller 1200. The buffer memory 1220 may include a plurality of memory lines for storing data and/or a command.

The error correction circuit 1230 can calculate an error correction code value of data to be programmed in a write operation, can correct an error of data read in a read operation on the basis of an error correction code value and can correct an error of data recovered from the nonvolatile memory device 1100 in a data recovery operation. Although not illustrated, a code memory storing code data needed to drive the SSD controller 1200 may be further included. The code memory may be embodied by a nonvolatile memory device.

The host interface 1240 may provide an interface function with an external device. The host interface 1240 may be a NAND interface. The nonvolatile memory interface 1250 may provide an interface function with the nonvolatile memory device 1100.

Example embodiments of inventive concepts may be applied to an eMMC (embedded multimedia card), a moviNAND, iNAND, etc.

Figure 12:
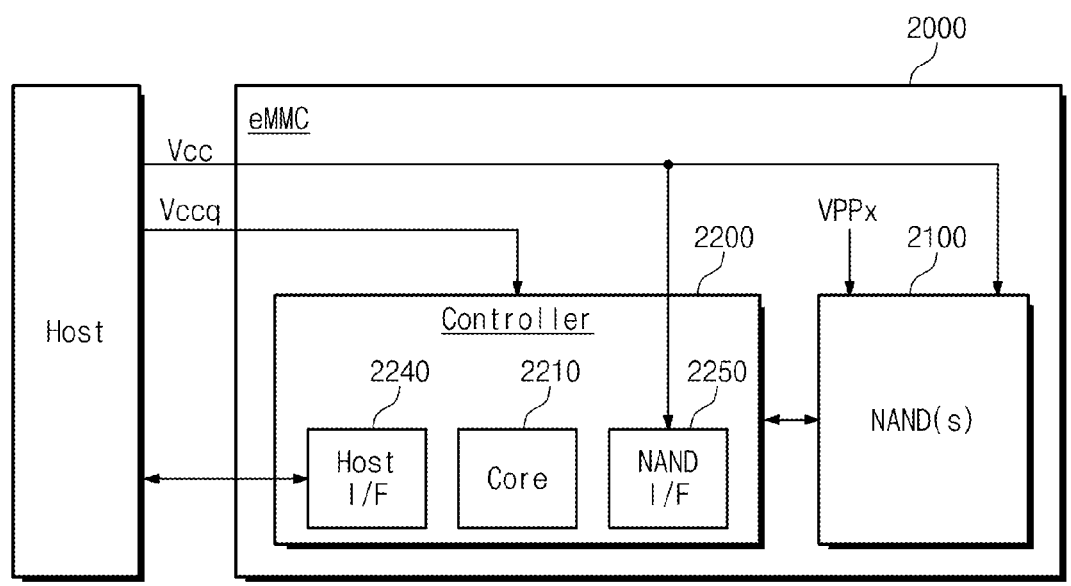
FIG. 12 is a block diagram illustrating an eMMC in accordance with example embodiments of inventive concepts.

FIG. 12 is a block diagram illustrating an eMMC in accordance with example embodiments of inventive concepts. Referring to FIG. 12, an eMMC 2000 may include at least one NAND flash memory device 2100 and a controller 2200.

The NAND flash memory device 2100 may be a SDR (single data rate) NAND or a DDR (double data rate) NAND. The NAND flash memory device 2100 may be a VNAND (vertical NAND). The NAND flash memory device 2100, as described in FIG. 1 through 10, can control a bit line development time according to the temperature. Thus, the NAND flash memory device 2100 can optimize a distribution of cells according to a temperature to reduce an operation error.

The controller 2200 may be connected to the NAND flash memory device 2100 through a plurality of channels. The controller 2200 may include at least one control core 2210, a host interface 2240, and a NAND interface 2250. The control core 2210 can control an overall operation of the eMMC 2000. The host interface 2240 can perform an interface between a host and the controller 2200. The NAND interface 2250 performs an interface between the NAND flash memory device 2100 and the controller 2200. In some embodiments, the host interface 2240 may be a parallel interface (e.g., a MMC interface). In example embodiments, the host interface 2240 may be a serial interface (e.g., a UHS-II, UFS interface).

The eMMC 2000 may be provided with power supply voltages Vcc and Vccq from the host. A first power supply voltage Vcc (e.g., 3.3V) may be provided to the NAND flash memory device 2100 and the NAND interface 2250. A second power supply voltage Vccq (e.g., 1.8V/3.3V) may be provided to the controller 2200. The eMMC 2000 may be selectively provided with an external high voltage Vpp.

Example embodiments of inventive concepts may be applied to a UFS (universal flash storage) system.

Figure 13:
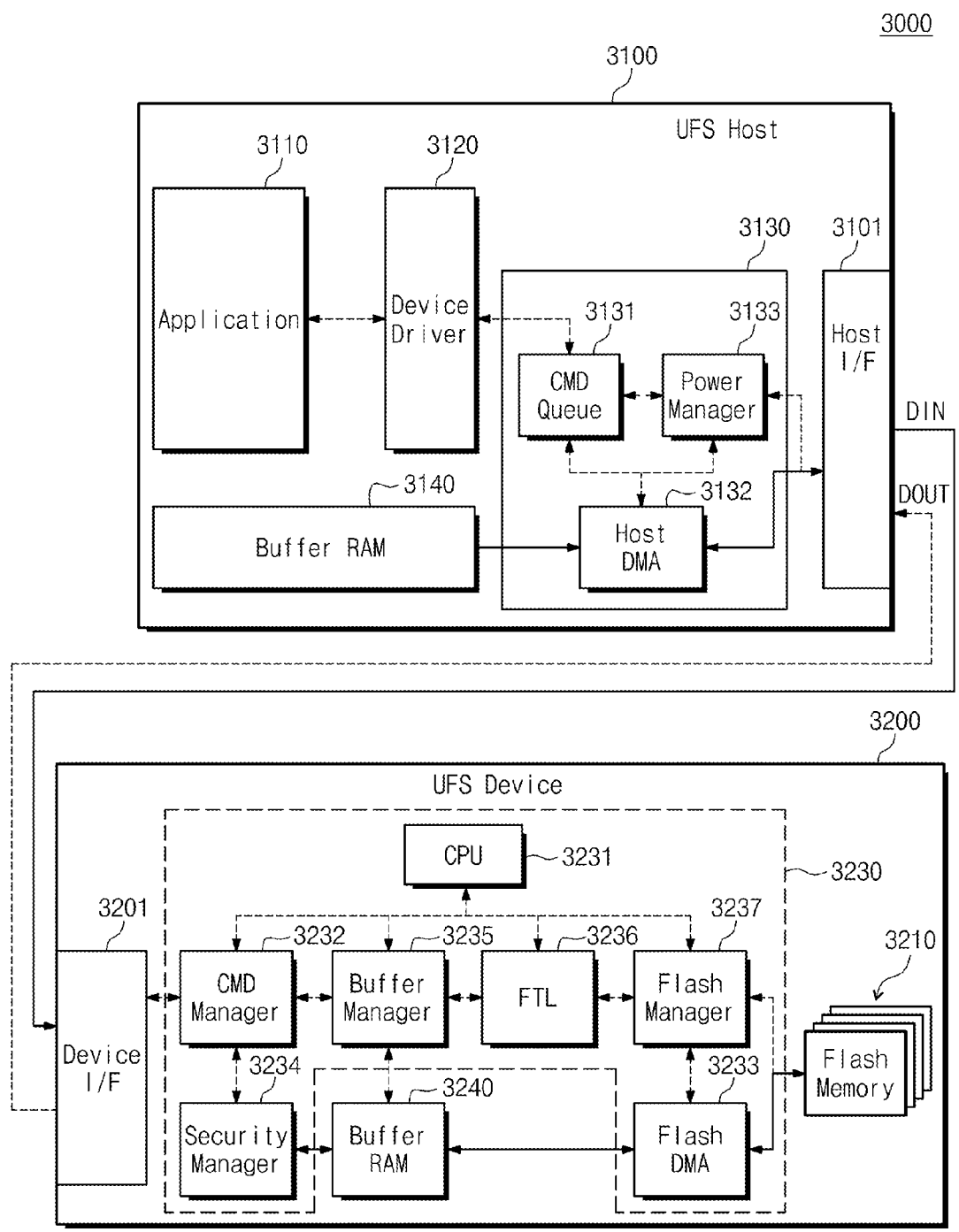
FIG. 13 is a block diagram illustrating a UFS system in accordance with example embodiments of inventive concepts.

FIG. 13 is a block diagram illustrating a UFS system in accordance with example embodiments of inventive concepts. Referring to FIG. 13, the UFS system 3000 may include a UFS host 3100 and a UFS device 3200.

The UFS host 3100 may include an application 3110, a device driver 3120, a host controller 3130, and a buffer RAM 3140. The host controller 3130 may include a command queue 3131, a host DMA 3132, and a power manager 3133. The command queue 3131, the host DMA 3132, and the power manager 3133 may operate in algorism, software, or firmware in the host controller 3130.

A command (e.g., write command) generated in the application 3110 of the UFS host 3100 and the device driver 3120 may be inputted to the command queue 3131 of the host controller 3130. The command queue 3131 can sequentially store commands to be provided to the UFS device 3200. A command stored in the command queue 3131 may be provided to the host DMA 3132. The host DMA 3132 transmits a command to the UFS device 3200 through a host interface 3101.

The UFS device 3200 may include a flash memory 3210, a device controller 3230, a device interface 3201, and a buffer RAM 3240. The device controller 3230 may include a CPU (central processing unit) 3231, a command manager 3232, a flash DMA 3233, a security manager 3234, a buffer manager 3235, a PTL (flash translation layer) 3236, and a flash manager 3237. The command manager 3232, the security manager 3234, the buffer manager 3235, the PTL (flash translation layer) 3236, and the flash manager 3237 may operate in algorism, software, or firmware in the device controller 3230.

The flash memory 3210, as described in FIGS. 1 through 10, can control a bit line development time according to a temperature. Thus, flash memory 3210 can improve and/or optimize a distribution of cells according to a temperature to reduce an operation error.

A command inputted from the UFS host 3100 to the UFS device 3200 may be provided to the command manager 3232 through a device interface 3201. The command manager 3232 interprets the command provided from the UFS host 3100 and can certify the provided command using the security manager 3234. The command manager 3232 can assign the buffer RAM 3240 to receive data through the buffer manager 3235. When a data transmission preparation is completed, the command manager 3232 transmits an RTT (READY_TO_TRANSFER) UPIU to the UFS host 3100.

The UFS host 3100 can transmit data to the UFS device 3200 in response to the RTT UPIU. The data may be transmitted to the UFS device 3200 through the host DMA 3132 and the host interface 3101. The UFS device 3200 can store provided data in the buffer RAM 3240 through the buffer manager 3235. Data stored in the buffer RAM 3240 may be provided to the flash manager 3237 through the flash DMA 3233. The flash manager 3237 can store data in a selected address of the flash memory 3210 with reference to address mapping information of flash mapping information.

If a data transmission and a data program needed in a command are completed, the UFS device 3200 transmits a response signal informing a completion with respect to the command to the UFS host 3100. The UFS host 3100 informs the device driver 3120 and the application 3110 of the completion with respect to the command and can finish an operation with respect to a corresponding command.

Example embodiments of inventive concepts are applicable to a mobile device.

Figure 14:
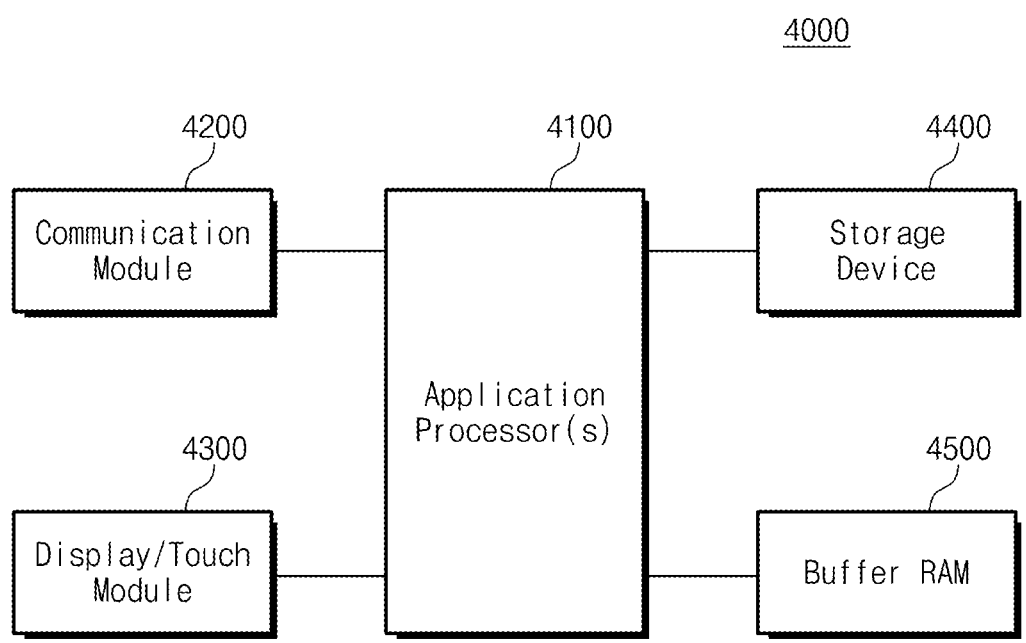
FIG. 14 is a block diagram illustrating a mobile device in accordance with example embodiments of inventive concepts.

FIG. 14 is a block diagram illustrating a mobile device in accordance with example embodiments of inventive concepts. Referring to FIG. 14, the mobile device 4000 may include an application processor 4100, a communication module 4200, a display/touch module 4300, a storage device 4400 and a mobile RAM 4500.

The application processor 4100 can control an overall operation of the mobile device 4000. The communication module 4200 may be embodied to control a wired/wireless communication with the outside. The display/touch module 4300 may be embodied to display data processed in the application module 4100 or to receive data from a touch panel. The storage device 4400 may be embodied to store data of a user. The storage device 4400 may be an eMMC, a SSD, a UFS, etc. The mobile RAM 4500 may be embodied to temporarily store data needed in an operation of operating the mobile device 4000.

The storage device 4400, as described in FIGS. 1 through 10, can control a bit line development time according to a temperature. The storage device 4400 can optimize a distribution of cell according to a temperature to reduce an operation error.

The memory system or the storage device may be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Example embodiments of inventive concepts may provide a nonvolatile memory device that controls a bit line development time according to a temperature to reduce an operation error and an operation method thereof. It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
a memory cell;
a bit line;
a page buffer connected to the memory cell through the bit line, the page buffer configured to precharge the bit line to perform a desired operation, wherein the desired operation is one of a read operation and a verify operation; and
control logic configured to control a bit line development time differently during the desired operation according to a temperature, wherein the bit line development time is after precharging the bit line during the desired operation,
the control logic configured to determine the bit line development time according to a period of a reference clock signal that includes a different frequency depending on the temperature.

2. The nonvolatile memory device of claim 1, wherein
the control logic is configured to cut off a supply of a precharge voltage during the desired operation,
the control logic is configured to compare a voltage level of the bit line with a reference value after cutting off the supply of the precharge voltage, and
the bit line development time corresponds to an elapsed time after the control logic cuts off the supply of the precharge voltage until the control logic compares the voltage level of the bit line with the reference value.

3. The nonvolatile memory device of claim 1, wherein
the control logic is configured to control the bit line development time to become shorter at a second temperature compared to the bit line development time at a first temperature if the second temperature is higher than the first temperature.

4. The nonvolatile memory device of claim 1, wherein
the control logic is configured to generate the reference clock signal to have a higher frequency at a second temperature than at a first temperature if the second temperature is higher than the first temperature.

5. The nonvolatile memory device of claim 1, wherein
the control logic includes a temperature voltage generator and a reference clock generator,
the temperature voltage generator is configured to generate a temperature voltage that varies depending on the temperature based on temperature information, and
the reference clock generator is configured to generate a reference clock signal that includes a different frequency depending on the temperature based on the temperature voltage.

6. The nonvolatile memory device of claim 5, wherein
a second temperature is higher than a first temperature,
the temperature voltage generator is configured to generate the temperature voltage to have a lower level at the second temperature than at the first temperature, and
the reference clock generator is configured to generate the reference clock signal to have a higher frequency at the second temperature than at the first temperature.

7. A nonvolatile memory device comprising:
a memory cell;
a bit line;
a page buffer connected to the memory cell through the bit line, the page buffer configured to precharge the bit line to perform a desired operation, wherein the desired operation is one of a read operation and a verify operation; and
control logic configured to generate a temperature compensation pulse signal having a pulse width that varies based on a temperature,
the control logic configured to control a bit line development time differently based on the pulse width of the temperature compensation pulse signal, wherein the bit line development time is after precharging the bit line during the desired operation, wherein the control logic includes a temperature voltage generator, a reference current generator, and a temperature compensation pulse generator, the temperature voltage generator is configured to generate a temperature voltage that varies depending on the temperature based on temperature information, the reference current generator is configured to provide a reference current to the temperature compensation pulse generator regardless of the temperature based on a first reference voltage, and the temperature compensation pulse generator is configured to determine the pulse width of the temperature compensation pulse signal based on a voltage reduced from the temperature voltage at a specific rate according to the reference current and a second reference voltage.

8. The nonvolatile memory device of claim 7, wherein the temperature compensation pulse generator is configured to determine the specific rate according to the reference current regardless of the temperature.

9. The nonvolatile memory device of claim 7, wherein
a first temperature is less than a second temperature,
the temperature voltage generator is configured to generate the temperature voltage to have a lower level at the second temperature than at the first temperature, and
the temperature compensation pulse generator is configured to generate the temperature compensation pulse signal to have a large pulse width at the second temperature than at the first temperature.

10. The nonvolatile memory device of claim 7, wherein the reference current generator includes:
a first resistor including one end connected to a ground terminal and an other end connected to a first node;
a second resistor including one end connected to the first node;
a first comparator configured to output a comparison result value based on the first reference voltage and a voltage of the first node;
a first transistor including one end connected to the other end of the second resistor, an other end of the first transistor being connected to a power supply terminal, the first transistor configured to turn on according to an output of the first comparator;
a second transistor including one end connected to the power supply terminal and an other end connected to a second node, and the second transistor configured to turn on according to the output of the first comparator; and
a third transistor including one end connected to the second node and an other end connected to the ground terminal, and the third transistor configured to turn on according to a voltage level of the second node.

11. The nonvolatile memory device of claim 10, wherein the temperature compensation pulse generator includes:
a fourth transistor including one end connected to the ground terminal and an other end connected to a third node, the fourth transistor configured to turn on according to the voltage level of the second node;
a fifth transistor including one end connected to the third node and an other end connected to a fourth node;
a sixth transistor including one end connected to the fourth node and an other end of which is connected to a temperature voltage terminal;
a first capacitor connected between the fourth node and the ground terminal; and a second comparator configured to generate the temperature compensation pulse signal based on the second reference voltage and a voltage of the fourth node,
wherein the fifth and sixth transistors are configured to complementarily turn on or turn off according to a start signal.

12. The nonvolatile memory device of claim 11, wherein the first capacitor is configured to charge based on the temperature voltage and is configured to discharge based on the reference current, and
the voltage of the fourth node is determined according to charge and discharge of the first capacitor.

13. The nonvolatile memory device of claim 11, wherein the voltage of the fourth node is reduced from the temperature voltage according to a time constant of the first capacitor.

14. The nonvolatile memory device of claim 10, wherein the reference current is determined according to the voltage level of the first node.

15. A nonvolatile memory device comprising:
a memory cell array;
a bit line connected to the memory cell array;
a page buffer connected to the memory cell array through the bit line, the page buffer configured to precharge the bit line during an operation; and
control logic configured to control a bit line development time differently during the operation according to a temperature, wherein the bit line development time is after precharging the bit line during the operation,
the control logic configured to determine the bit line development time based on at least one of,
a period of a reference clock signal that has a different frequency depending on the temperature, and
a temperature compensation pulse signal generated by the control logic that includes a pulse width that vanes based on the temperature, wherein
the control logic is configured to determine the bit line development time based on the period of the reference clock signal,
the control logic is configured to configured to cut off a supply of a precharge voltage to the hit line during the operation,
the control logic is configured to detect a state of a memory cell in the memory cell array during the operation based on comparing a voltage level of the bit line with a reference value after cutting off the supply of the precharge voltage,
the bit line development time corresponds to an elapsed time after the control logic cuts off the supply of the precharge voltage until the control logic compares the voltage level of the bit line with the reference value, and
the control logic is configured to control the bit line development time to become shorter at a second temperature compared to the bit line development time at a first temperature if the second temperature is higher than the first temperature.

16. The nonvolatile memory device of claim 15, wherein the operation is one of a read operation and a verify operation.

17. The nonvolatile memory device of claim 15, wherein the memory cell array includes a plurality of strings on a substrate, and
each of the strings includes a plurality of memory cells stacked on top of each other between a ground selection transistor and a string selection transistor.

* * * * *